(12) United States Patent
Yamoto et al.

(10) Patent No.: US 6,645,835 B1
(45) Date of Patent: Nov. 11, 2003

(54) SEMICONDUCTOR FILM FORMING METHOD AND MANUFACTURING METHOD FOR SEMICONDUCTOR DEVICES THEREOF

(75) Inventors: Hisayoshi Yamoto, Kanagawa (JP); Hideo Yamanaka, Kanagawa (JP); Hajime Yagi, Tokyo (JP); Yuuichi Sato, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/527,027

(22) Filed: Mar. 16, 2000

(30) Foreign Application Priority Data

Mar. 16, 1999 (JP) .............................. 11-069642

(51) Int. Cl.[7] .................. H01L 21/20; H01L 21/36; H01L 21/31; H01L 21/469
(52) U.S. Cl. ................. 438/503; 438/478; 438/479; 438/481; 438/482; 438/794
(58) Field of Search ................. 438/478, 479, 438/481, 482, 794, 503

(56) References Cited

U.S. PATENT DOCUMENTS

| | | | |
|---|---|---|---|
| 5,963,822 A | * 10/1999 | Saihara et al. | 438/481 |
| 5,981,363 A | * 11/1999 | Gardner et al. | 438/585 |
| 6,225,241 B1 | * 5/2001 | Miyoshi | 438/794 |
| 6,372,558 B1 | * 4/2002 | Yamanaka et al. | 438/149 |

OTHER PUBLICATIONS

Qi Wang, Guozhen Yue, Jing Li, Daxing Han, A Combination Study of Materials In Transition From Amorphous To Microcrystalline Silicon, Aug. 13, 1999, Elsevier, vol. 113, No. 3, pp. 175–178.*

* cited by examiner

*Primary Examiner*—Matthew Smith
*Assistant Examiner*—Chuong Luu
(74) *Attorney, Agent, or Firm*—Rader, Fishman & Grauer PLLC; Ronald P. Kananen

(57) ABSTRACT

A method for forming a semiconductor film capable allowing easy cleaning of the processing equipment and capable of forming an epitaxial film at low temperatures as well as a manufacturing method for semiconductor devices utilizing this forming method is needed for achieving selective crystalline growth on semiconductor film. The forming method comprises a process for forming a mask having an aperture exposing a substrate surface on substrate, and a process for forming a semiconductor film by selective crystalline growth on a semiconductor piece by means of catalytic chemical vapor deposition on a substrate surface exposed by an aperture on a mask; as well as a manufacturing method for semiconductor devices utilizing the semiconductor film forming method.

8 Claims, 4 Drawing Sheets

SEMICONDUCTOR FILM FORMING METHOD AND MANUFACTURING METHOD FOR SEMICONDUCTOR DEVICES THEREOF

BACKGROUND OF THE INVENTION

1. Field of the Invention

The present invention relates to a method for forming a semiconductor film utilizing the chemical vapor deposition (CVD) method and in particular relates to a method for forming a semiconductor film utilizing a catalytic chemical vapor deposition (CVD) method for forming deposits of activated gas material by means of a catalytic piece and also to a manufacturing method for semiconductor devices utilizing this forming method.

2. Description of Related Art

In the typically used method for growing an epitaxial film of silicon, a silicon substrate is heated to a temperature of approximately 700° C. to 1200° C. and gas material such as silane, dichlorosilane, trichlorosilare and silicon tetrachloride made to react and breakdown in a hydrogen atmosphere, at 100 to 760 Torr.

The silicon film obtained by this kind of epitaxial growth is subjected to submicron processing by lithographic technology or etching technology and patterned in the desired configuration in order to utilize the silicon film for instance as logic gates or interconnections in semiconductor devices.

However, increasing demands are being made for lower cost and improved productivity so that simplifying and reducing the steps in this process has also become necessary.

In view of this situation, when forming the above mentioned silicon film, rather than performing patterning after developing the epitaxial film, a better approach is to selectively develop the epitaxial film and eliminate the silicon film patterning process.

More specifically, when growing an epitaxial film of silicon, a mask of silicon oxide having an aperture is formed on the silicon substrate. Hydrogen chloride gas is then mixed into the gas material and a vapor reaction made to occur by methods such as heat chemical vapor deposition (CVD) so that epitaxial silicon is selectively developed only on the silicon substrate surface within the aperture exposed by the mask, and the depositing of polysilicon film on the silicon oxide can be prevented. Preventing the deposit of silicon onto the surface of the silicon oxide film is possible because the hydrogen chloride gas mixed into the gas material becomes activated and etches away the surface of the oxide silicon film.

However, in this method using hydrogen chloride gas mixed into the gas material, the hydrogen chloride breaks down, and the chloride that is formed pollutes the inside of the reaction chamber so that maintenance (cleaning) of the processing equipment is required, thus creating the disadvantage that time is required for cleaning.

Also since this method uses hydrogen chloride gas mixed in with the gas material, the energy causing a chemical reaction from the gas material, and the energy causing epitaxial growth (single crystalline growth) of the generated silicon onto the surface of the silicon substrate, are all supplied in the form of heat energy to the silicon substrate from the heater installed on the substrate holder (susceptor). The temperature of the silicon substrate warmed by the heater or in other words, the epitaxial temperature cannot be greatly reduced from approximately 700° C., which in turn places large restrictions on the selection of material forming this substrate and the elements formed on this substrate.

A further disadvantage of this method is that since the heating temperature of the silicon substrate cannot be reduced when for instance, the basic elements on the substrate are polysilicon diffused with impurities, these impurities might possibly re-diffuse in the silicon during the process.

SUMMARY OF THE INVENTION

In view of the;above described problems with the related art, this invention therefore has the object of providing a method for forming a semiconductor film, that allows easy cleaning of the processing equipment and is capable of forming an epitaxial film at low temperatures as well as a manufacturing method for semiconductor devices until zing this forming method to achieve selective crystalline growth of semiconductor film.

As a means to eliminate the above described problems, the method for forming a semiconductor film of this invention comprises a process for forming a mask having an aperture exposing the substrate surface on the substrate, and a process for forming a semiconductor film by selective crystalline growth on a semiconductor piece by means of catalytic chemical vapor deposition (CVD) on the substrate surface exposed by an aperture on the mask. this forming method, a mask is formed of at least one type from among silicon oxide, silicon nitride, or silicon oxygen-nitride on a semiconductor piece, and by heat breakdown and activation with a catalytic piece if performing catalytic chemical vapor deposition (CVD) using hydrogen gas, selective etching is performed using gas material having clusters of high energy hydrogen atoms or hydrogen molecules, so that silicon is not deposited on the mask at a certain time yet crystalline growth is made to selectively occur on the substrate.

In the CVD method, the high energy to cause the gas material to chemically react is basically supplied by the catalytic piece, and just an amount of energy necessary to develop the epitaxial film (single crystalline growth) on the substrate surface of the silicon, or in other words just an amount of energy needed to align the silicon atoms in the direction of crystallization on the substrate surface is applied, so that the heating temperature of the substrate itself can be a low temperature of for instance, 100° C. to 700° C.

To further, eliminate the above described problems, the manufacturing method for semiconductor devices of this invention comprises a process for forming a mask having an aperture exposing the substrate surface on the substrate, and a process for forming a semiconductor film by selective crystalline growth on a semiconductor piece by means of catalytic chemical vapor deposition (CVD) on the substrate surface exposed by an aperture on the mask, and a process for performing a specified processing on the semiconductor film and form semiconductor devices.

By performing the specified processing on the semiconductor film obtained by the above described semiconductor film forming method, and forming semiconductor devices by the manufacturing method for semiconductor film of this invention, the above described effects are obtained so selective crystalline growth of semiconductor film on the substrate surface can be performed at low temperatures.

DETAILED DESCRIPTION OF THE PREFERRED EMBODIMENTS

The embodiments of the invention are next described in detail.

Figure 1A:
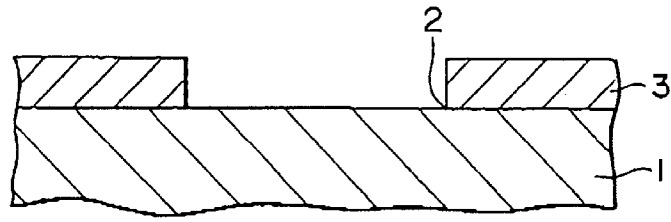
FIG. 1A and FIG. 1B are essential side cross sectional views describing the process sequence of the forming method for the semiconductor film of this invention.
Figure 1B:
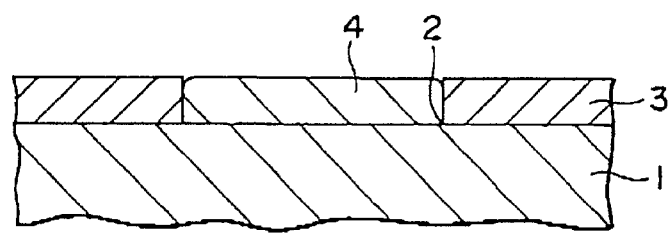

FIGS. 1A and 1B are views illustrating an embodiment of the process sequence of the forming method for the semiconductor film of this invention. The reference numeral 1 in FIGS. 1A and 1B denotes the silicon substrate and this silicon substrate 1 is the substrate of this invention.

In order to selectively develop the epitaxial film (crystalline growth) as the semiconductor film on the silicon substrate 1, a mask 3 is first of all formed having an aperture 2 exposing a portion of the silicon substrate formed by epitaxial growth as shown in FIG. 1A. This mask 3 is formed by a method such as chemical vapor deposition (CVD) of a film (not shown in drawing) consisting of at least one type from among silicon oxide, silicon nitride, or silicon oxygen-nitride on a semiconductor piece, and patterning then formed afterwards by lithographic technology or etching technology of the known art.

Next, the silicon substrate 1 formed with the mask 3 in this way, is washed with diluted hydrofluoric acid (fluid content 1% to 5%), and the thin oxidized film (auto-oxidized film) of the silicon substrate 1 exposed in the aperture 2 of the mask 3 then removed. Washing and then drying is performed.

Figure 2:
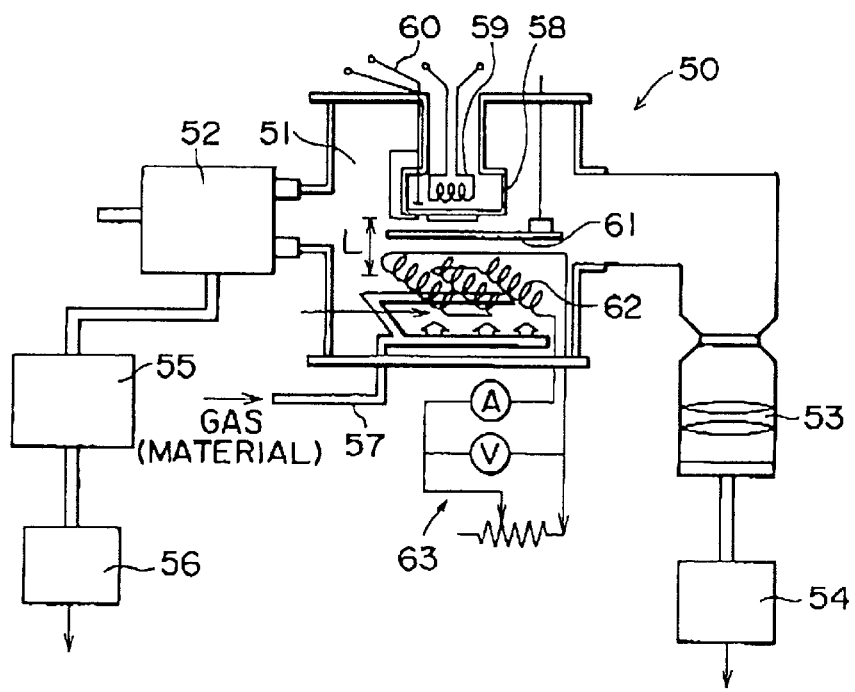
FIG. 2 is a concept view of the structure of the catalytic chemical vapor deposition device utilized in this invention.
Figure 3:
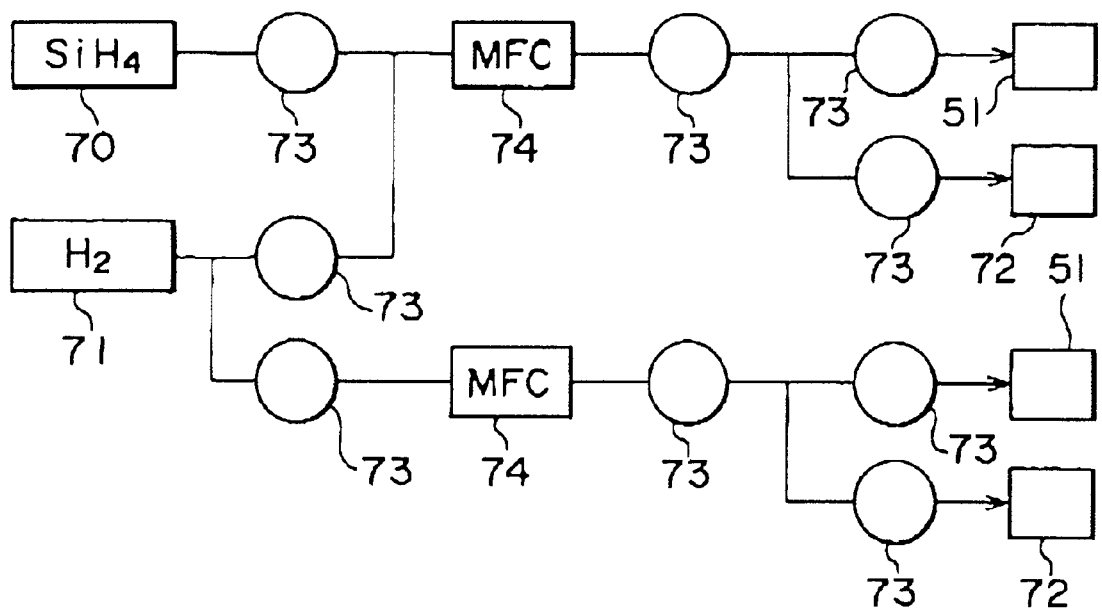
FIG. 3 is a concept view of the reactive gas control system connecting to the catalytic chemical vapor deposition device.

Next, crystalline growth of the silicon is selectively performed by the catalytic chemical vapor deposition (CVD) method by means of a catalytic CVD device 50 as shown in FIG. 2. Then a silicon epitaxial film 4 is formed on the silicon substrate 1 exposed in the aperture 2 by means of the mask 3 as shown in FIG. 1B.

Here, the overall structure of the catalytic CVD device 50 as shown in FIG. 2 is explained. This catalytic CVD device 50 comprises a reaction chamber 51 for processing the device material and a prechamber 52 connecting to this reaction chamber 51, a turbomolecular pump 52 and a rotary pump 54 are connected in sequence to the reaction chamber 51, and a turbomolecular pump 55 and a rotary pump 56 are connected in the same way to a prechamber 52.

In the reaction chamber 51, a gas pipe 57 is connected to a gas supply source (not shown in drawing) by way of a reactive gas supply system (not shown in drawing), and gas material for depositing the film is supplied to the reaction chamber 51 from this gas pipe 57. Also, the upper part of the reaction chamber 51 has a substrate holder (susceptor) 58 for setting a glass substrate 1 utilized as the workpiece. A heater 59 and a thermocouple 60 are installed in this substrate holder 58.

In a substrate holder 58 having this kind of structure, the sample material can be heated by the heater 59 by way of the substrate holder 58. The thermocouple 60 detects the temperature in the substrate holder 58 and controls the extent of the heating by means of the heater 59. A silicon-coated graphite susceptor can for instance be utilized as the substrate holder 58.

A shutter 61 is installed beneath this substrate holder 58, and a catalyst piece 62 is installed beneath this shutter 61. The catalyst piece 62 may be made from filament wound in a coil shape from, for example fine tungsten wire connected to a power supply 63 outside the reaction chamber 51. Heating up to approximately 1600° C. to 1800° C. can be maintained by supplying electrical power from the power supply 63. The catalytic piece 62 is installed at the upper part of the gas material supply inlet (not shown in drawing) of the gas material pipe 58 inside the reaction chamber 51 and the gas material for depositing the film supplied from the gas material pipe 58 is heated, broken down and activated.

In the reaction gas supply system connecting to the material gas pipe 57, a silane gas supply source 70 and a hydrogen supply source 71 are respectively connected to the reaction chamber 51 and an exhaust pump 72 so that the regulator valve 73 installed in each pipe can control utilization of the circuit of each reactive gas pipe. In other words, from the hydrogen supply source 71, the pipes are separated into two circuits (or systems). One circuit connects to the pipe from the silane supply source 70, and the other circuit connects to an independent circuit connecting to the reaction chamber 51 and the exhaust pump 72.

A pipe from the silane gas supply source 70 also connects to the reaction chamber 51 and the exhaust pump 72. However, after the supply of silane from the silane gas supply source 70 is finished, the inner pipeline path is purged by flushing with hydrogen from the hydrogen supply source 71 by means of the pipe connecting from the other circuit described above that connects to the hydrogen supply source 71. A mass flow controller (MFC) 71 is installed in both the independent circuit from the hydrogen supply source 71, and the circuit from the silane gas supply source 70 so that the flow rate in either circuit can be regulated to the desired quantity.

In order to selectively form the silicon epitaxial film 4 on the silicon substrate 1 as described above by means of the catalytic CVD device 50 and the reactive gas control system, the silicon substrate 1 formed with the mask 3 in the state shown in FIG. 1A, is set on the substrate holder 58 by way of the prechamber 52 of the catalytic CVD device 50.

Next, the turbo molecular pump 55 and the rotary pump 56 are operated and the interior or the reaction chamber 51 decompressed to approximately 1 to $2 \times 10^{-6}$ PA, and this state maintained for five minutes in particular to remove any moisture or oxygen brought into the reaction chamber 51.

The silicon substrate 1 heated and maintained at a temperature of 200° C. to 600° C. by way of the substrate holder 58 and the heater 59 and in this example is maintained at a temperature of 200° C. Hydrogen is supplied from the reaction gas control system inside the reaction chamber 51 and that flow rate as well as the pressure inside the reaction chamber 51 regulated to specific values. Here, the pressure in the reaction chamber 51 is set to approximately 0.1 to 15 Pa, and in this example is set to 1.0 Pa.

The power supply 63 is then turned on to supply power to the catalyst piece 62, the temperature raised to 1600° C. to 1800° C. In this example the temperature is set to 1800° C. This state is maintained for 10 minutes.

Next, the silane $SiH_4$ is also fed into the reaction chamber 51 from the reaction gas control system. In other words, in this example, gas material is supplied into the reaction chamber 51 by setting the hydrogen flow rate to 120 sccm/minute, and the silane ($SiH_4$) flow rate to 9 sccm/minute (100% silane).

When the material gas is supplied in this way into the reaction chamber 51, the hydrogen atoms are heated and activated by means of the catalytic piece 62 so that the hydrogen atoms etch the oxidized silicon film. The thin auto-oxidized film formed in a thickness of 1.5 to 1.8 nm on the surface of the silicon substrate 1 within the aperture 2 of the mask 3 is thus etch-removed. A silicon epitaxial film is then developed (or grown) at a forming speed of 60 nm per minute, on the exposed surface of the silicon substrate 1 where the auto-oxidized film. was removed. In this example, a silicon epitaxial film 4 with a thickness of 1.2 $\mu$m was formed by causing epitaxial development by supplying gas material into the reaction chamber 51 for 20 minutes.

On the mask 3, activated hydrogen atoms perform etching of the surface of the mask 3 by means of the catalytic piece 62 so that no silicon. is deposited on this surface during that time. consequently, an epitaxial film 4 is selectively formed on the surface of the silicon substrate 1. When the etching speed of the oxidized silicon film formed at high temperatures was investigated, the speed was confirmed as 1.5 to 2.0 nm per 20 minutes at 200° C.

Here, the significance of the statement that, "no silicon is deposited or this surface (of mask 3) during that time." is that when foreign matter is in the material gas or foreign matter is inside the reaction chamber 51, or substances resulting from the reaction such as silicon are adhering to the surface of the mask 3, silicon with these foreign objects as a core might develop on the surface of the mask 3. This phrase therefore means that, "no silicon is deposited on this surface (of mask 3) during the time in which such foreign matter that might form a core for the silicon, and adhere to the mask 3 surface."

The actual time in which foreign matter forming a core adheres to the surface of the mask 3 differs according to the processing conditions. In the conditions of this example, no deposits of silicon were observed on the mask 3 surface even after 20 minutes of processing and so this time is thought to be 20 minutes or more.

After the silicon is selectively formed as an epitaxial film in this way, the flow rate of the silane $SiH_4$ gas is set to zero and only the flow of hydrogen gas is continued. After this state has continued for five minutes, the flow of electrical power to the catalyst piece 62 is stopped and the temperature lowered. Next, the flow rate of hydrogen gas is set to zero, and the pressure inside the reaction chamber 51 further decreased to 1 to $2 \times 10 \times 10^{-6}$ Pa, and this state maintained for five minutes to evacuate any silane $SiH_4$ gas that was fed into the chamber.

Afterwards, the silicon substrate 1 is extracted byway of the prechamber 52 to the outside air.

In the above description, n epitaxial film was formed as the silicon film however an epitaxial film for instance of silicon-geranium (Si—Ge) may also be selectively formed in the same way. In such case, germane ($GeH_4$) as a source of germanium is supplied along with hydrogen and silane ($SiH_4$) gas, as the gas material for depositing the film and the germane content may be set in a range from 1 to 10 at%.

Also, in the above example, silane $SiH_4$ and hydrogen were utilized as the gas material for depositing the film but hydrogen chloride (HC1) or chloride ($Cl_2$) or hydrogen bromide (HBr) or bromine ($Br_2$) can be utilized.

Also in this method for forming (silicon epitaxial film 4) a semiconductor film, heat breakdown and activation with a catalytic piece were performed. By then selectively etching with high energy clusters of hydrogen atoms or hydrogen molecules, selective crystalline growth (epitaxial development) of the silicon can be performed just on the surface of the silicon substrate 1 without forming deposits of silicon on the mask 3.

The energy supplied from the silicon substrate 1 for activating the gas material for depositing the film per the catalyst, can be reduced so that the silicon substrate 1 may use a low temperature of for example 200° C.

Also, silane $SiH_4$ and hydrogen are utilized as the gas material for depositing the film and hydrogen chloride is riot used so that maintenance (cleaning) of the processing equipment is easy to perform.

Next, an example of the manufacturing method for semiconductor film of claim 5 of this invention is applied to the fabrication of elevated S/D (source/drains) is described and an example comprising the embodiment of the manufacturing method for semiconductor film of claim 9 is described while referring to FIG. 4A through FIG. 4E.

Figure 4A:
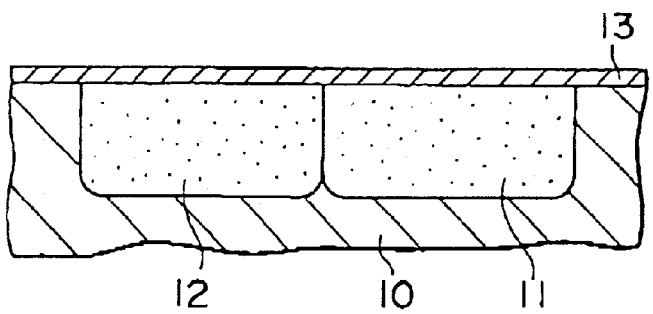
FIG. 4A through FIG. 4E are essential cross sectional views describing the manufacturing process sequence of the manufacturing method, by drawings showing an embodiment applicable to production of elevated S/D (source/drain) in the manufacturing method for semiconductor devices of this invention.

First, as shown in FIG. 4A, a silicon substrate 10 is prepared. A P-well 11 and an N-well 12 are formed in sequence or this silicon substrate 10 using the same technique as in the related art. An $SiO_2$ film is further formed on this silicon substrate 10 in a thickness of approximately 100 nm.

In the forming the P-well 11, $B^+$ ions are injected under conditions of a dosing energy of 100 keV, and a dose of $2 \times 10^{13}$ atoms/cm$^2$. Next, heating is performed for 6 hours at a temperature of 1200° C. in a nitrogen environment, and heating further performed for two hours 1200° C. in an oxygen environment. Also, when forming the N-well, $P^+$ ions are injected under conditions of a dosing energy of 150 keV, and a dose of $5 \times 10^{12}$ atoms/cm$^2$, and heating then performed for four hours at 1140° C. in a nitrogen+oxygen environment.

Figure 4B:
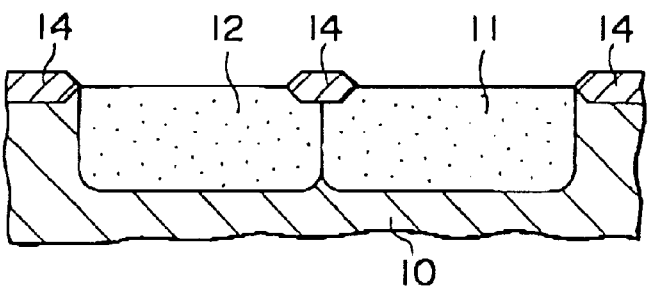

Next, LOCOS oxidation is performed at 980° C. using the technology of the known art, and a field oxidation film 14 formed to a thickness of 600 nm as shown in FIG. 4B.

First of all, total surface etching is performed with diluted hydrofluoric acid on the silicon substrate 10 and the $SiO_2$ film removed. Next, Pad oxidation is performed at about 950° C. to form a Pad oxidation film in a thickness of approximately 60 nm (not shown in drawing), and an SiN film (not shown in drawing) formed on the Pad oxidation film in a thickness of about 1200 nm. by a method such as chemical vapor deposition (CVD) at a temperature of 800° C. or lower. Patterning of this SiN film is then performed using lithographic technology and etching technology of the known art, and afterwards LOCOS oxidation performed as previously described.

Figure 4C:
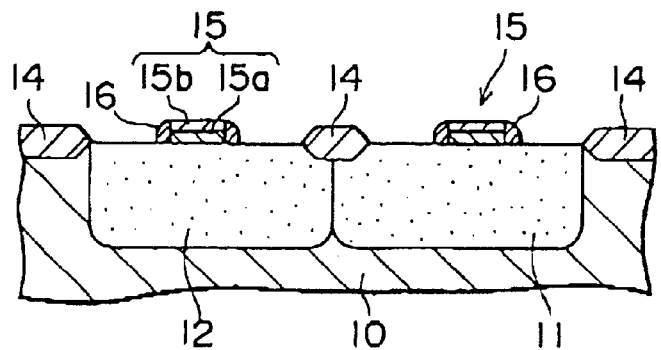

A gate oxidation film (not shown in drawing) is processed at 950° C. and formed in a thickness of 200 nm as shown in FIG. 4C. A gate 15 and a sidewall 16 are also respectively formed by technology of the known art on the P-well 11 and the N-well 12.

The gate 15 has a polycide structure formed of a $WSi_x$ film 15b on a polysilicon film 15a doped with impurities (such as phosphor) in the polysilicon.

Figure 4D:
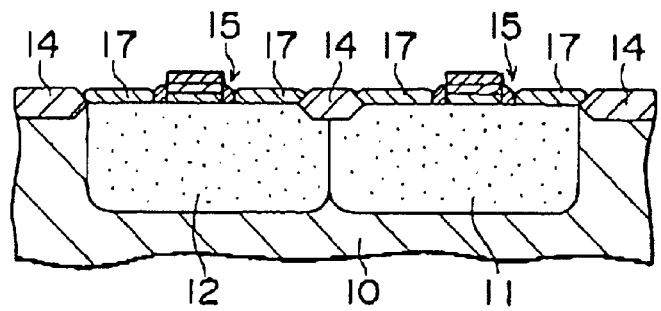

The oxidized film for the source/drain region forming the silicon epitaxial film respectively for the P-well 11 and the N-well 12 is removed by etching with diluted hydrofluoric acid. Then, the same processing as the embodiment of the previous semiconductor film forming method is performed on this silicon substrate 10 using catalytic chemical vapor deposition device 50 as shown in FIG. 2, and by heating the silicon substrate 10 to a comparatively low temperature of 600° C., a silicon epitaxial film 17 is formed to a thickness of 50 to 300 nm as shown in FIG. 4D, and in this example is 120 nm thick. The silicon epitaxial film 17 formed in this way, does not need to comprise a total epitaxial film, and has no problems in functioning as a crystalline structure approximating polysilicon.

Here, since a field oxidation film 14 is formed on the surface of the silicon substrate 10, this film 14 functions as the mask 3 shown in FIG. 1 so that silicon is not deposited here and a silicon epitaxial film 17 can consequently be selectively formed on the silicon substrate 10.

Polysilicon is deposited on $WSi_x$ film 15b on the gate 15 however since this accumulated polysilicon film exerts virtually no adverse effects on the operation of the gate 15, it can be left as is without being removed in subsequent processes.

Ion implantation into the silicon epitaxial film 17 obtained as described above is performed and an optimal carrier concentration is used.

In this ion implantation, the source/drain region is heated for 30 minutes at a temperature of 900° C. in an oxygen atmosphere, and an oxidized film of 30 nm thickness formed. Afterwards, a pattern with an opening (aperture) on the N channel side, or in other words, only on the P-well 11 side is formed. This pattern is utilized as the mask and $As^+$ ions are injected under conditions of a dosing energy of 70 keV, and a dose of $5 \times 10^{15}$ atoms/cm$^2$, and annealing then performed for 20 minutes at 950° C. in a nitrogen environment.

Continuing with the above process, a pattern with an opening (aperture) on the P channel side, or in other words, only on the N-well 12 side is formed. This pattern is utilized as the mask and $BF_2^+$ ions are injected under conditions of a dosing energy of 30 keV, and a dose of $5 \times 10^{15}$ atoms/cm$^2$, and annealing then performed for 5 minutes at 950° C. in a nitrogen environment.

Figure 4E:
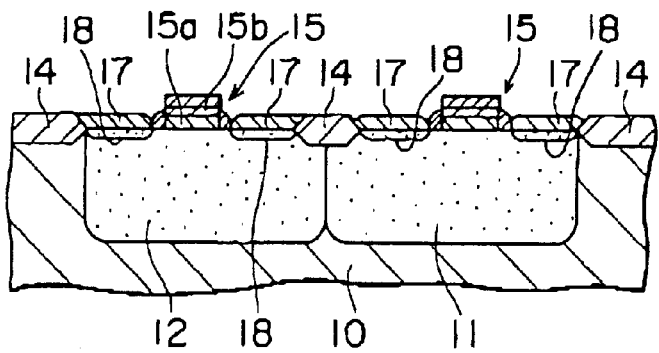

Ion implantation is thus performed on the silicon epitaxial film 17, and by further performing annealing, a source/drain region 18 are respectively formed in the P-well 11 and the N-well 12 of this silicon epitaxial film 17 as shown in FIG. 4E.

In this manufacturing method, a silicon epitaxial film 17 is formed by means of thermal chemical vapor deposition (CVD) so that the silicon substrate 10 can be maintained at a comparatively low temperature of 600° C. compared to the high temperature of 900° C. to 1000° C. which must be used in the heat CVD method. The rediffusion of impurities in the polysilicon film 15 can therefore be prevented in the gate 15, and the pollution of the $WSi_x$ film 15b and the high resistance in the polysilicon film 15a that accompany rediffusion can also be prevented.

Figure 5:
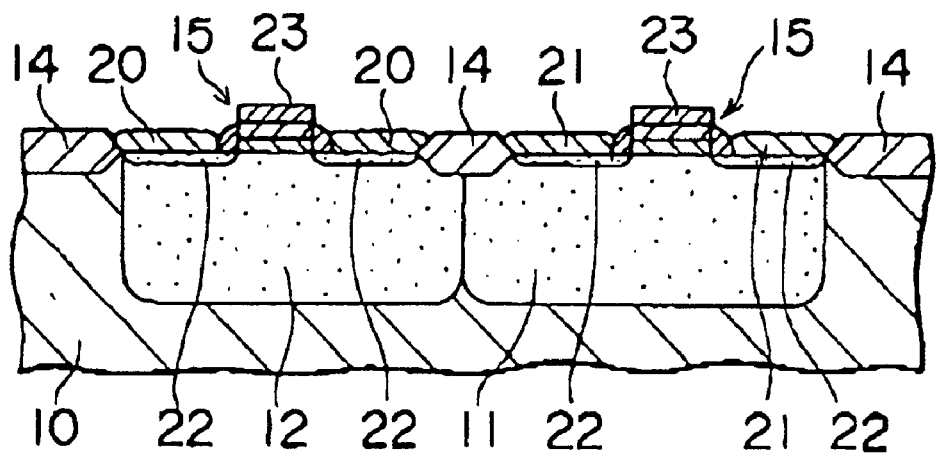
FIG. 5 is an essential side cross sectional view showing a first variation of the manufacturing method for the elevated S/D (source/drain) shown in FIG. 4A through FIG. 4E.

FIG. 5 is a drawing showing a first variation of the manufacturing method for the elevated S/D (source/drain)

The point where the example shown in FIG. 5 differs from the examples shown in FIG. 4A through FIG. 4E is that when forming the silicon epitaxial film, doping impurities are introduced beforehand into the gas material for depositing the film, and so that the silicon epitaxial film obtained, already contains impurities.

In other words, in this example, after the gate 15 is formed as shown in FIG. 4C, first of all, a mask (not shown in drawing) having an opening (aperture) only on the N well 12 surface is formed of oxidized silicon film and nitrided silicon film by technology of the known art. Next, an epitaxial film of P type silicon introduced with impurities such as boron, is developed only on the N well 12 by catalytic chemical vapor deposition (CVD) and a P type silicon epitaxial film 20 approximately 50 to 300 nm thick is formed.

Next, the mask is removed, and a new mask (not shown in drawing) having an opening (aperture) only on the P well 11 surface is formed of oxidized silicon film and nitrided silicon film by technology of the known art. Then, an epitaxial film of N type silicon introduced with impurities such as phosphor is developed only on the P well 11 by catalytic chemical vapor deposition, and an N type silicon epitaxial film 21 approximately 50 to 300 nm thick is formed.

Ion implantation of impurities such as boron is performed on the P type silicon epitaxial film 20 as well as the N well 12 film beneath it, and the impurity concentration adjusted. In the same way, ion implantation of impurities such as phosphor is performed on the N type silicon epitaxial film 21 as well as the P well 11 beneath it, and the impurity concentration adjusted.

Then, heat diffusion processing is performed for 30 minutes at 800° C., and the respective sources/drains 22 formed in the respective N well 12 and the P well 11 beneath the P type silicon epitaxial film 20 and the N type silicon epitaxial film 21. Due to the heat diffusion of impurities implanted beforehand in the P type silicon epitaxial film 20 and the N type silicon epitaxial film 21, these impurities enclose the lower portion of the sidewall 16 at this time and as a consequence, an LDD effect is obtained.

In this kind of manufacturing method, there is no effect from the thickness of the P type silicon epitaxial film 20 and the N type silicon epitaxial film 21, and the source/node junction positions of the source/drain 22 can be formed in a stable state. The LDD effect can also be obtained.

The film 23 installed on the gate 15 in FIG. 5 is a portion of the mask used when forming the silicon epitaxial films 20 and 21. This film 23 is left as is and utilized, without being removed during ion implantation.

Figure 6:
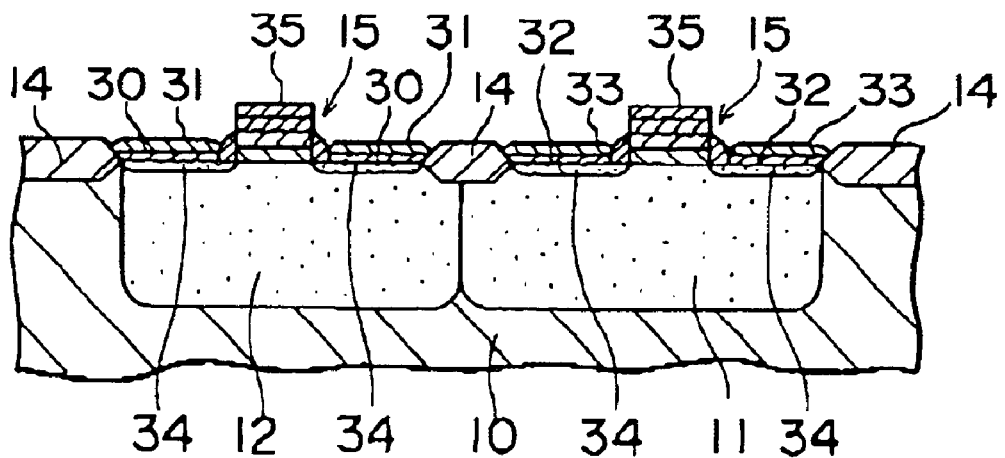
FIG. 6 is an essential side cross sectional view showing a second variation of the manufacturing method for the elevated S/D (source/drain) shown in FIG. 4A through FIG. 4E.

FIG. 6 is a drawing showing a second variation of the manufacturing method for the elevated S/D (source/drain).

The point where the example shown in FIG. 6 differs from the examples shown in FIG. 4 is that when forming the silicon epitaxial film, doping impurities are introduced beforehand into the gas material for depositing the film, so that the silicon epitaxial film obtained, already contains impurities.

In other words, in this example, after the gate 15 is formed as shown in FIG. 4C, first of all, a mask (not shown in drawing) having an opening (aperture) only on the N well 12 surface is formed of oxidized silicon film and nitrided silicon film by technology of the known art. Next, an epitaxial film of P type silicon introduced with impurities such as boron, is developed only on the N well 12 by catalytic chemical vapor deposition (CVD), and a low-concentration P type silicon epitaxial film 30 approximately 50 nm thick is formed with an impurity concentration of $10^{15}$ to $10^{16}$ (atoms/cm$^2$). Next, a high-concentration P type silicon epitaxial film 31 approximately 50 nm thick is formed of the same P type impurities in a concentration of $10^{19}$ to $10^{20}$ (atoms cm$^2$)

Next, the mask is removed, and a new mask (not shown in drawing) having an opening (aperture) only on the P well 11 surface is formed of oxidized silicon film and nitrided silicon film by technology of the known art. Then, an epitaxial film of N type silicon introduced with impurities such as phosphor is developed only on the P well 11 by catalytic chemical vapor deposition, and an N type low-concentration silicon epitaxial film 32 approximately 50 nm thick is formed with an impurity concentration of $10^{15}$ to $10^{16}$ (atoms/cm$^2$). Next, an N type high-concentration silicon epitaxial film 33 approximately 50 mm thick is formed of the same N type impurities in a concentration of $10^{19}$ to $10^{20}$ (atoms/cm$^2$)

Then, heat diffusion processing is performed as in the previous example, and the respective sources/drains 34 are formed in the respective N well 12 and the P well 11 beneath the P type low-concentration silicon epitaxial film 30 and the N type low-concentration silicon epitaxial film 32. Due to the heat diffusion of impurities the same as shown in the example in FIG. 5, these impurities enclose the lower portion of the sidewall 16 at this time and as a consequence, an LDD effect is obtained.

This kind of manufacturing method is simplified since the process for ion implantation has been eliminated, and the LDD effect can also be obtained, the same as in the previous example.

The film 35 installed in two layers on the gate 15 in FIG. 6 is a portion of the mask used when forming the silicon epitaxial films 30, 31, 32, 33. This film 35 is left unchanged and utilized, without being removed, the same as in the previous example.

In the example described in the embodiment, a silicon substrate was utilized as the substrate, however this invention is not limited to this substrate and may for instance utilize a sapphire substrate or a spinel substrate having a lattice constant almost identical to silicon crystal. A silicon epitaxial film can also be selectively formed for these substrates, at a low substrate temperature of approximately 100° C. to 700° C.

In one effect of the forming method for semiconductor film of this invention as described above, crystal is selectively grown (or developed) on a semiconductor film by catalytic chemical vapor deposition (CVD) on the substrate surface exposed by an aperture on the mask, so that the mask for instance is formed of at least one type from among silicon oxide, silicon nitride, or silicon oxygen-nitride on a semiconductor piece of silicon, and by means of heat breakdown. and activation with a catalytic piece, by utilizing hydrogen mixed with the gas material if performing catalytic chemical vapor deposition (CVD), and by selectively etching with clusters of high energy hydrogen atoms or hydrogen molecules, an effect is rendered that silicon is not deposited on the mask for a certain time and silicon can be made to selectively develop on the substrate.

Another effect of the invention is that in the catalytic chemical vapor deposition (CVD) method, the high energy to cause the gas material to chemically react is basically supplied by the catalytic piece, and just an amount of energy necessary to develop the epitaxial film (single crystalline growth) on the substrate surface of the silicon, or in other words just an amount of energy needed to align the silicon atoms in the direction of crystallization on the substrate surface is applied, so that the heating temperature of the substrate itself can be a low temperature of for instance, 100° C. to 700° C.

Yet another effect of the invention is that when silicon is utilized as the substrate, the auto-oxidized film formed (for instance in a thickness of 1.5 to 1.8 nm) on the silicon surface can be removed by selective etching at a low temperature as previously described.

In an effect of the manufacturing method for semiconductor devices of this invention, by performing specified processing on the semiconductor film obtained by the above described semiconductor film forming method, to fabricate the semiconductor element, the above described effects allow forming a selective crystalline growth of semiconductor film on the substrate surface at low temperatures.

Still another effect of the invention is that when impurities have been diffused into the polysilicon as basic elements of the semiconductor device, the crystalline growth can be achieved at a low temperature so that a cause of rediffusion of impurities in the polysilicon can be prevented.

What is claimed is:

1. A semiconductor film forming method comprising:

forming a mask having an aperture exposing the substrate surface on the substrate, said mask comprising at least one type from among silicon oxide, silicon nitride, and silicon oxygen-nitride, and forming a silicon semiconductor film by selective crystalline growth by means of catalytic chemical vapor deposition on said substrate surface exposed inside said aperture of said mask.

2. A semiconductor film forming method as claimed in claim 1, wherein said substrate comprises at least one type from the group consisting of silicon, sapphire and spinel.

3. A semiconductor film forming method as claimed in claim 1, wherein hydrogen gas is utilized when performing said catalytic chemical vapor deposition.

4. A manufacturing method for a semiconductor film comprising:

forming a mask having an aperture exposing a substrate surface on the substrate, said mask comprising at least one type from among silicon oxide, silicon nitride, and silicon oxygen-nitride, forming a silicon semiconductor film by selective crystalline growth by means of catalytic chemical vapor deposition on said substrate surface exposed inside said aperture of said mask, and performing a treatment on said semiconductor film and forming semiconductor devices on said film.

5. A manufacturing method for a semiconductor film as claimed in claim 4, wherein said substrate comprises at least one type from the group consisting of silicon, sapphire and spinel.

6. A manufacturing method for a semiconductor film as claimed in claim 4, wherein hydrogen gas is utilized when performing said catalytic chemical vapor deposition.

7. A manufacturing method for a semiconductor film, comprising:

forming a mask having an aperture exposing a substrate surface on the substrate, said mask comprising at least one type from among silicon oxide, silicon nitride, and silicon oxygen-nitride, forming a silicon semiconductor film by selective crystalline growth by means of catalytic chemical vapor deposition on said substrate surface exposed inside said aperture of said mask, and performing a treatment on said semiconductor film and forming semiconductor devices on said film wherein after forming said mask, a gate is formed on said silicon substrate surface exposed inside the aperture of the mask, and afterwards silicon is made to selectively develop by means of catalytic chemical vapor deposition to form a silicon epitaxial film on said silicon substrate surface exposed inside the aperture of the mask, and then said silicon epitaxial film is doped with impurities to form source and drain regions.

8. A manufacturing method for a semiconductor film as claimed in claim 7, wherein said silicon epitaxial film is doped with said impurities to form a source and drain by implanting said impurities while selectively forming silicon as a crystalline growth by the catalytic chemical vapor deposition to form said silicon epitaxial film.

* * * * *